United States Patent [19]

Blöckl

[11] Patent Number: 5,187,384
[45] Date of Patent: Feb. 16, 1993

[54] METHOD AND CIRCUIT CONFIGURATION FOR TRIGGERING A SEMICONDUCTOR SWITCH THROUGH THE USE OF AN INDUCTIVE TRANSFORMER

[75] Inventor: Reinhard Blöckl, Unterharching, Fed. Rep. of Germany

[73] Assignee: Siemens Aktiengesellschaft, Munich, Fed. Rep. of Germany

[21] Appl. No.: 584,756

[22] Filed: Sep. 18, 1990

[30] Foreign Application Priority Data

Sep. 19, 1989 [EP] European Pat. Off. ........ 89117326.2

[51] Int. Cl.$^5$ ...................... H03K 17/56; H03K 17/61
[52] U.S. Cl. .................. 307/246; 307/247.1; 307/262; 307/273; 307/546; 363/56
[58] Field of Search ............ 307/246, 247.1, 262, 307/273, 547, 549, 362; 363/56

[56] References Cited

U.S. PATENT DOCUMENTS

| | | | |
|---|---|---|---|
| 2,986,677 | 5/1961 | Hechler, IV | 307/363 |
| 3,659,214 | 4/1972 | Iijima | 307/273 |
| 4,005,317 | 1/1977 | Hinrichs | 307/273 |
| 4,117,819 | 10/1978 | Jarrett et al. | 307/363 |
| 4,559,591 | 12/1985 | Grünsch | 363/56 |
| 4,652,809 | 3/1987 | Barn | 363/56 |
| 4,736,285 | 4/1988 | Cohen | 363/56 |
| 4,870,298 | 9/1989 | Telefus | 307/247.1 |

Primary Examiner—William L. Sikes
Assistant Examiner—Terry D. Cunningham
Attorney, Agent, or Firm—Herbert L. Lerner; Laurence A. Greenberg

[57] ABSTRACT

A method for triggering a semiconductor switch with an inductive transformer having a primary side and having a secondary side connected to the semiconductor switch to be triggered includes dissipating magnetic energy that may be stored in the transformer from the transformer with a circuit configuration for demagnetization of the transformer. A switch potential of a given polarity is subsequently applied to the primary side of the transformer for switching the semiconductor switch. An increase of the potential on the primary side of the transformer beyond an allowable value is prevented after the demagnetization of the transformer. A circuit configuration for triggering a semiconductor switch includes an inductive transformer having a primary winding and having a secondary winding connected to the semiconductor switch to be triggered. A control input is connected to a logic circuit. At least one controllable switch is connected between the logic circuit and the primary winding for switching a voltage with a given polarity to the primary winding. At least one free-running element is connected to the primary winding for switching a voltage with a polarity opposite the given polarity to the primary winding. A detector means is connected to the primary winding for detecting a conclusion of a demagnetization of the transformer. Another switch is connected to the primary winding for short-circuiting the primary winding.

4 Claims, 2 Drawing Sheets

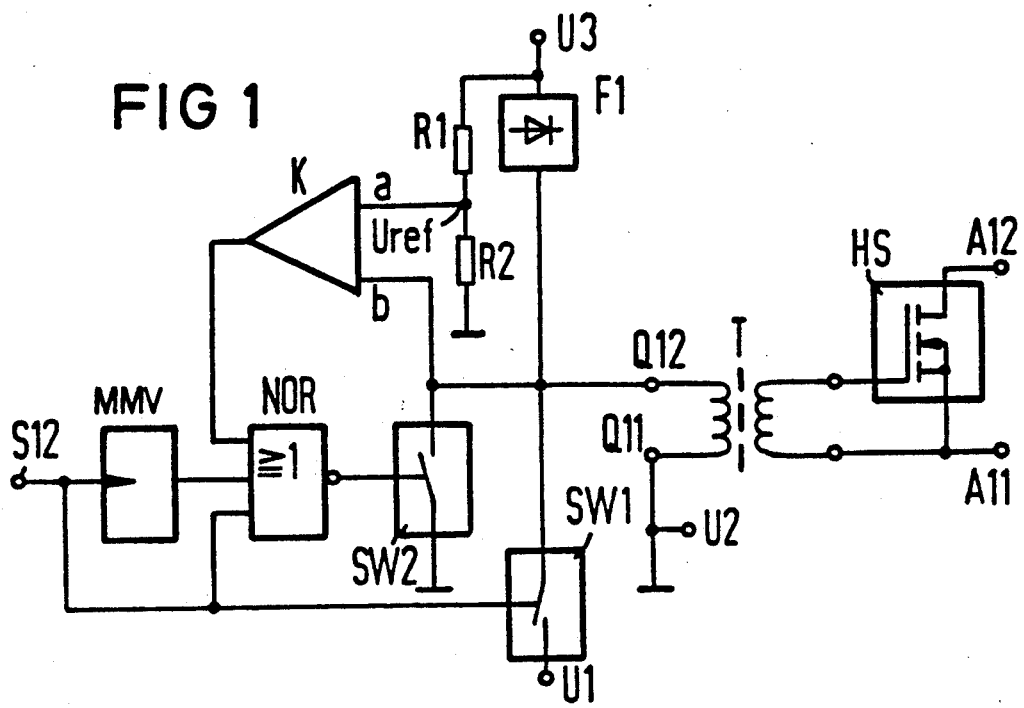
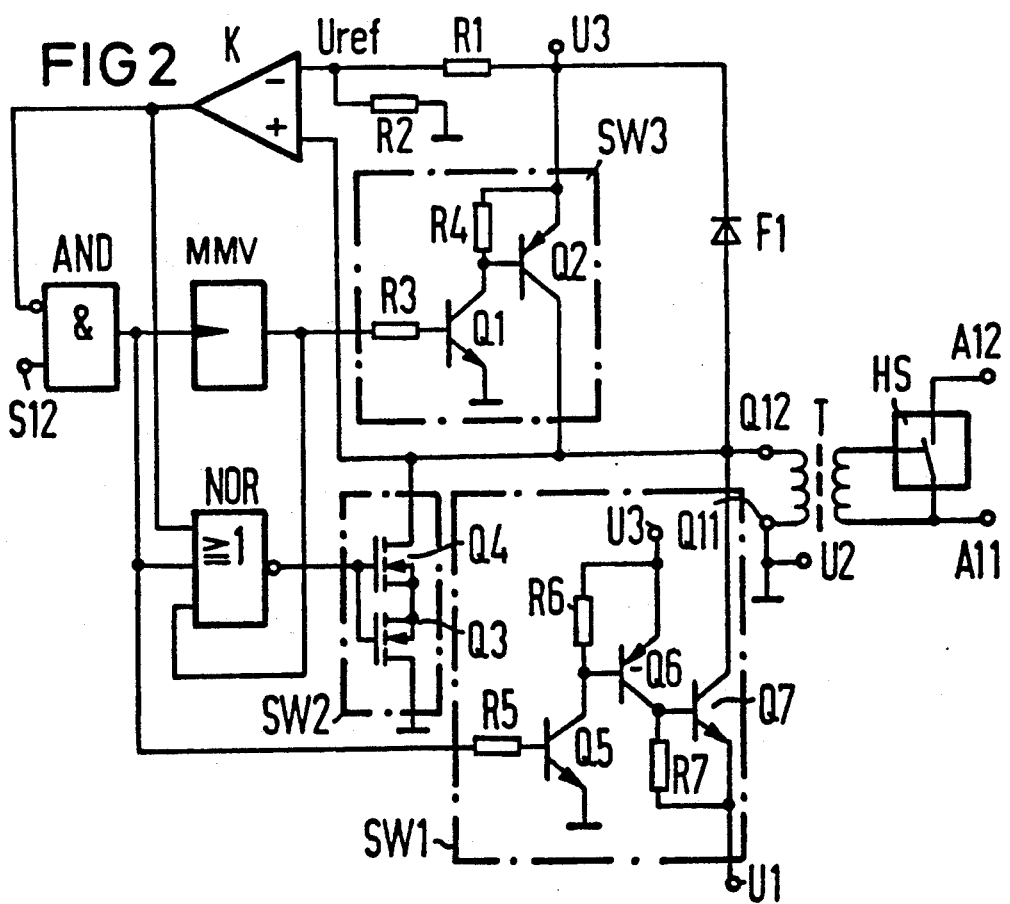

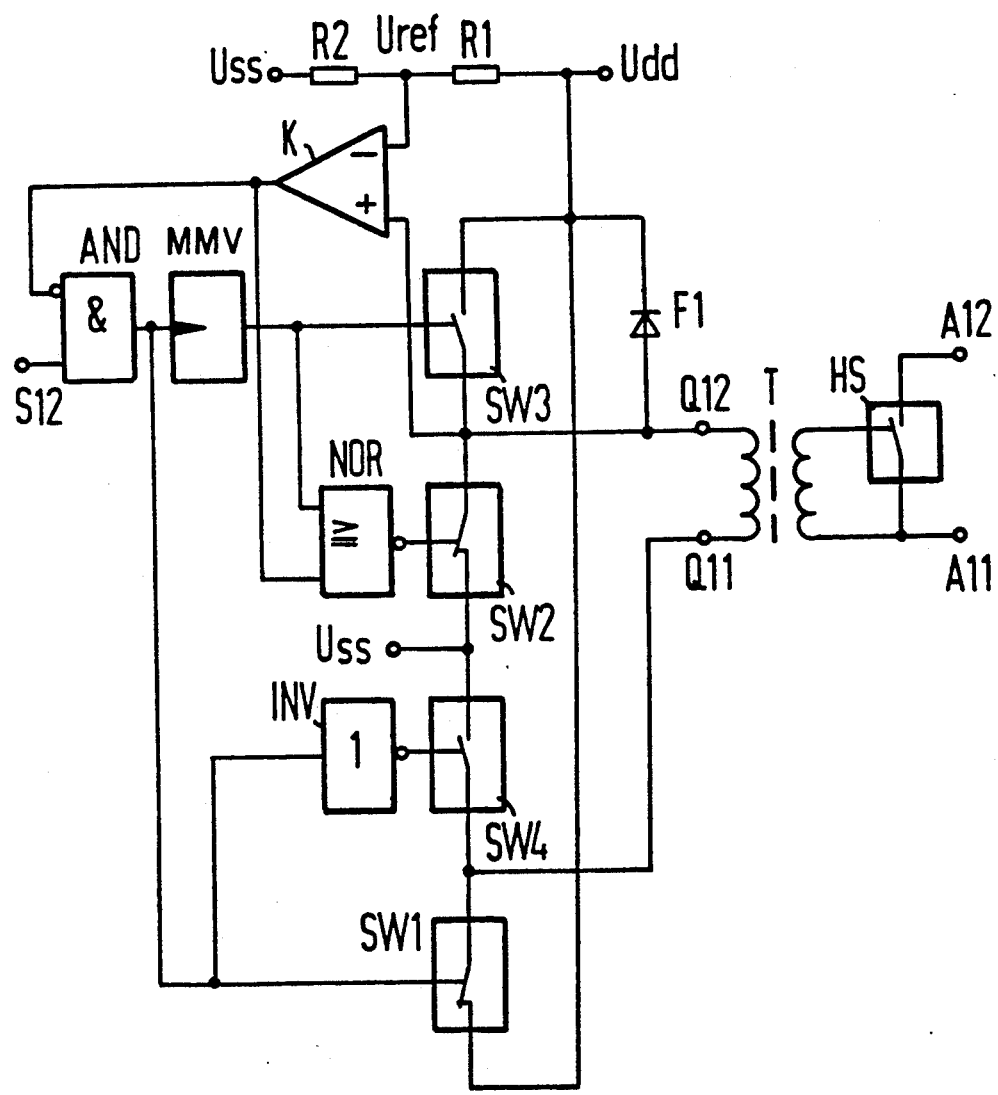

METHOD AND CIRCUIT CONFIGURATION FOR TRIGGERING A SEMICONDUCTOR SWITCH THROUGH THE USE OF AN INDUCTIVE TRANSFORMER

BACKGROUND OF THE INVENTION

1. Field of the Invention

The invention relates to methods for triggering a semiconductor switch through the use of an inductive transformer having a primary side and a secondary side, wherein the semiconductor switch to be triggered is disposed on the secondary side of the transformer, a switch potential of a given polarity applied to the primary side of the transformer leads to the switching of the semiconductor switch. Before electrical energy is supplied to the primary side of the transformer, effecting a switching operation at the semiconductor switch, magnetic energy that may be stored in the transformer is dissipated from the transformer with the aid of a circuit configuration for demagnetization of the transformer. The invention also relates to circuit configurations for triggering an inductive transformer triggering a semiconductor switch, including a control input, a logic circuit with at least one controllable switch for switching a voltage to the primary winding of the transformer, and at least one free-running element for switching a voltage of opposite polarity to the primary winding of the transformer.

2. Description of the Related Art

Such methods and circuit configurations are known in principle. Depending on the structure of the inductive transformer, they are used not only for potential-free triggering of semiconductor switches, but they are also used to increase the triggering current or triggering voltage. Such methods and circuit configurations are used in combinational circuits, and in particular in resonance converter combinational circuits, among others.

In known generic methods of that type, the semiconductor switch is typically triggered by a pulse-width modulated signal, optionally having a variable frequency and variable duty cycle. Unless countermeasures are taken, the direct current component of such trigger signals causes the transformer to become magnetically saturated, rendering purposeful triggering of the semiconductor switch impossible.

Among other sources, an article entitled "Zuverlässiger Betrieb von MOSFETs in Brückenschaltungen" [Reliable Operation of MOSFETs in Bridge Circuits] by H. R. Hässig and P. Zeller, in Elektronik [Electronics] No. 10, 1989, pp. 55–63, and in particular FIG. 1b on page 56, discloses a method for triggering a semiconductor switch in which a trigger signal is capacitively coupled in to the inductive transformer. The capacitor used in that method keeps the DC component away from the primary side of the transformer. The capacitor is charged to a DC potential corresponding to the mean value of the trigger signal, and it sends alternating current signals that are superimposed on the DC potential, to the transformer. The voltage amplitudes of the AC signals are accordingly dependent on the level of the DC potential. In such configurations, changing the duty cycle of the trigger signal changes the DC component at the capacitor, and thus the amplitude of the trigger voltage at the semiconductor switch changes as well.

The publication entitled "Technische Mitteilung aus dem Bereich Bauelemente, Integrierte Schaltnetzteil-Steuerschaltungen mit TDA 4700/TDA 4718, Funktion und Anwendung" [Technical Report on Components, Integrated Combinational Circuit Control Circuits with TDA 4700/TDA 4718, Function and Use] of the firm Siemens, Munich, 1980, particularly FIG. 19 on page 29, discloses another method of that generic type. In that method, an inductive transformer having an additional demagnetizing coil is used. The additional demagnetizing coil is connected, in particular, through a diode to a fixed potential. Upon a corresponding change of the switching state of the semiconductor caused by the triggering, the field energy introduced into the transformer upon pulse transmission is caused to decay through the demagnetizing coil. Since the demagnetizing coil forms a resonant circuit together with parasitic circuit capacitors such as the input capacitor of the semiconductor switch, the field energy is typically made to decay periodically. In order to prevent a resultant unintended switching of the semiconductor switch, the secondary circuit of the inductive transformer must be correspondingly damped. Such damping of the secondary circuit of the transformer causes power losses, and must also be dimensioned in accordance with both the inductance and the capacitance that are operative in demagnetizing operations.

It is accordingly an object of the invention to provide a method and a circuit configuration for triggering a semiconductor switch through the use of an inductive transformer, which overcome the hereinafore-mentioned disadvantages of the heretofore-known methods and devices of this general type, in which the amplitude of the trigger voltage is not dependent on the duty cycle of the trigger signal and in which unintentional switching of the semiconductor switch caused by periodic demagnetization of the transformer is prevented.

SUMMARY OF THE INVENTION

With the foregoing and other objects in view there is provided, ed, in accordance with the invention, a method for triggering a semiconductor switch with an inductive transformer having a primary side and having a secondary side connected to the semiconductor switch to be triggered, which comprises dissipating magnetic energy that may be stored in the transformer from the transformer with a circuit configuration for demagnetization of the transformer, subsequently applying an electrical switch potential of a given polarity to the primary side of the transformer for switching the semiconductor switch, and preventing an increase of the potential on the primary side of the transformer beyond an allowable value after the demagnetization of the transformer.

An essential factor for a method according to the invention is that after demagnetization of the inductive transformer is concluded, the voltage on the primary side of the transformer is kept low enough to ensure that no voltage that can lead to switching of the semiconductor can arise on the secondary side of the transformer.

This can be achieved in accordance with another mode of the invention, by providing a method which comprises switching terminals of the primary side of the transformer to the same potential after the demagnetization of the transformer, or by short-circuiting the primary winding of the transformer.

Potential differences between the two connection terminals of the primary side of the transformer which are dictated by circuitry and which can, for instance, arise from p-n junctions in the primary-side circuit of the transformer, are not a problem in this case, as long as a potential that is dependent on the type of semiconductor switch and on the winding ratio of the transformer is not exceeded on the secondary side.

One possible criterion for concluding the demagnetization is that the current in the primary winding of the transformer is at the zero crossover or undergoes a change of algebraic sign (+ or −). Another possible criterion for concluding the demagnetization is that the voltage at the primary winding of the transformer attains a certain value. Both criteria can be detected with comparator circuits, in a manner known to one skilled in the art.

The demagnetization of the inductive transformer can be provided in a known manner by means of suitably switched recovery diodes, which switch the transformer to a demagnetization potential after the shutoff of the magnetization potential. However, electronic switches may be used instead of the recovery diode.

If the application of a switching potential to the primary side of the transformer causes the switching of the semiconductor switch that is to be triggered, for instance by closing it, then a further switching, for instance an opening of the semiconductor switch can be accelerated if, in accordance with a further mode of the invention, there is provided a method which comprises applying a demagnetization potential having a polarity opposite the polarity of the switching potential through a controllable switch to the primary side of the transformer, after the shutoff of the switching potential, lasting no longer than until the end of the demagnetization.

In accordance with an added mode of the invention, there is provided a method which comprises preventing the application of the demagnetization potential through the controllable switch throughout the demagnetization.

With the objects of the invention in view there is also provided a circuit configuration for triggering a semiconductor switch, comprising an inductive transformer for triggering the switch, having a primary winding and having a secondary winding connected to the semiconductor switch to be triggered, a control input, a logic circuit connected to the control input, at least one controllable switch connected between the control input and the primary winding for switching a voltage with a given polarity to the primary winding, at least one free-running element connected to the primary winding for switching a voltage with a polarity opposite the given polarity to the primary winding, detector means connected to the primary winding for detecting a conclusion of a demagnetization of the transformer, and other switch means connected to the primary winding for short-circuiting the primary winding.

In accordance with another feature of the invention, there is provided a switch connected parallel to the free-running element.

In accordance with a concomitant feature of the invention, the other switch means are bidirectionally conducting.

Other features which are considered as characteristic for the invention are set forth in the appended claims.

Although the invention is illustrated and described herein as embodied in a method and a circuit configuration for triggering a semiconductor switch through the use of an inductive transformer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a configuration according to the invention for performing methods according to the invention, for a case in which a first connection terminal Q11 of the primary winding of a transformer T is connected to a ground potential U2, and a second connection terminal Q12 of the transformer T is triggered by a trigger circuit, wherein the trigger circuit is supplied with first and second supply potentials U1 and U3, and the statement $U1 > U2 > U3$, or $U3 > U2 > U1$ applies;

FIG. 2 is a diagram of a circuit according to FIG. 1 for a case in which $U3 > U2 > U1$, with possible embodiments of the switches in the trigger circuit, with a third switch SW3 that accelerates demagnetization, and with an additional logic function element AND that prevents magnetic saturation of the transformer T; and FIG. 3 is a diagram of a circuit configuration according to the invention for performing methods according to the invention for a case in which only a supply voltage Udd is needed besides a ground voltage Uss; in which both connection terminals Q11 and Q12 of the primary winding of the transformer T are triggered by a trigger circuit; and in which a special case is illustrated wherein switches SW3 and SW4 for accelerating the demagnetization of the transformer T are provided, and the magnetic saturation of the transformer T is prevented by a logic function element AND.

DESCRIPTION OF THE PREFERRED EMBODIMENT:

Referring now to the figures of the drawing in detail and first, particularly, to FIG. 1 thereof, there is seen a circuit configuration for performing methods according to the invention, having a control input S12 which is connected to a control input of a first switch SW1, to an input of a monostable multivibrator MF which is triggered at a trailing edge, and to a first input of a NOR gate NOR. The output of the monostable multivibrator MF is connected to a second input of the NOR gate NOR, and a third input of the NOR gate NOR is interconnected with the output of a comparator K. The output of the NOR gate NOR is interconnected with the control input of a second switch SW2. The first terminal Q11 of the primary winding of the inductive transformer T is connected to a ground potential U2, as mentioned above. The second terminal Q12 of the primary winding of the inductive transformer T can be switched to the first supply potential U1 through the first switch SW1 and to the ground potential U2 through the second switch SW2. The second terminal Q12 is switched to the second supply potential U3 through a free-running element F1, for instance a recovery diode, and it is also connected to one input b of the comparator K. The other input a of the comparator K is acted upon by a reference potential Uref, which is set in the exemplary embodiment of FIG. 1 in such a way that the input a is connected through a first resistor R1 to the second supply potential U3 and through a second resistor R2 to the ground potential U2. For the case in which U3>U2>U1, the input a is the inverting input, and the input b is the non-inverting input of the comparator K, and an anode of the recovery diode F1 is connected to the terminal Q12 of the primary winding of the transformer T. One terminal of the secondary winding of the transformer T is connected to a control input of a semiconductor switch HS, which can open or close a path between output terminals A11 and A12. The other terminal of the secondary winding of the transformer T is connected to the output terminal A11.

The polarity of the various circuit elements such as the free-running element F1 and the inputs a and b of the comparator depends on the polarity of the supply potentials U1 and U3, on the type of semiconductor switch HS to be triggered, on the winding direction of the various windings of the transformer T, and on the mode of operation (as an opener or closer) of the semiconductor switch, in a manner known to one skilled in the art.

The mode of operation of an exemplary embodiment according to FIG. 1 will be described below. If an on-state signal is applied to the input S12, the first switch SW1 is switched on, and the second switch SW2 is switched off through the NOR function element. As a result, the primary winding of the transformer T is connected between the two potentials U1 and U2 and absorbs magnetic energy. A magnetization current in the direction of the potential difference is associated with the field buildup in the transformer T. At the same time, a secondary voltage, which is equivalent to the ratio of the number of windings, is applied as a control voltage to the semiconductor switch HS, that is switched on as a result. As long as an on-state signal is present at the control input S12, the switching state of the semiconductor switch HS remains unchanged.

If the on-state signal at the input S12 is switched off and thus changes to an off-state signal, then the monostable multivibrator MF triggered at the trailing edge delivers a pulse of constant duration to the input of the NOR gate NOR. As a result, the second switch SW2 remains blocked for the duration of the monostable multivibrator time constant, even without an on-state signal at the control input S12. After the disappearance of the on-state signal at its control input, the first switch SW1 likewise blocks.

Once both the first switch SW1 and the second switch SW2 are blocked after the disappearance of the on-state signal at the input S12, the transformer T acts as a current source because of its self-induction, and furnishes a current that agrees in direction and magnitude with the magnetization current. After the recharging of capacitors present on the transformer, such as the input capacitor of the semiconductor switch HS, the current flows through the free-running element F1, which to this end must be conducting for the applicable current direction. At that moment, a polarity that is the inverse of the trigger voltage is present at the control input of the semiconductor switch HS, so that the switch HS reliably blocks.

The recharging process in the transformer changes the voltage at the terminal Q12 and thus at the input b of the comparator K which serves as a detector means. Once the voltage at the terminal Q12 has attained the reference voltage Uref, the comparator K applies a voltage to one input of the NOR gate NOR and thus prevents the second switch SW2 from being able to close. The time constant of the monostable multivibrator MF must be selected in such a way that the output signal of the monostable multivibrator MF blocks the NOR gate NOR, after the disappearance of the trigger signal at the control input S12, until such time as the comparator K blocks the NOR gate NOR because of the recharging process in the transformer T. The magnetic field energy of the transformer T can be made to decay through the free-running element F1 when the switches SW1 and SW2 are open. In this process the demagnetization current decreases, becomes zero, and then changes its algebraic sign, so that the free running element F1 blocks. At the zero crossover of the demagnetization current, the transformer is in the energy-free state. The potential at the terminal Q12 of the primary winding of the transformer T is virtually equivalent to the supply potential U3 applied through the free-running element F1, and it then varies in the direction of the other supply potential U1. Once the potential at the terminal Q12 and thus at the input b of the comparator K attains the reference potential Uref applied to the terminal a of the comparator, the comparator K changes its output signal and thus enables one input of the NOR gate NOR. Advantageously, the reference potential Uref is selected in such a way that the comparator K enables the input of the NOR gate whenever the transformer T is largely energy-free, or in other words in the vicinity of the zero crossover of the demagnetization current. The time constant of the monostable multivibrator MF should be selected in such a way that even before this moment, the output of the monostable multivibrator will have enabled the second input of the NOR gate NOR. If a new on-state signal has not been applied to the control input S12 at that time, then the third input of the NOR gate NOR is also enabled, causing the output signal of the NOR gate NOR to make the second switch SW2 conductive.

Once the second switch SW2 is conductive, then the primary winding of the transformer T is short-circuited. The transformer T is accordingly in the energy-free or at least virtually energy-free state, and furthermore both the primary and secondary voltages at the transformer are 0 V or virtually 0 V. If at all possible, the second switch SW2 should be bidirectionally conductive, so that any residual currents can flow. Unintended switching of the semiconductor switch HS can be reliably prevented in this switching state if any possible residual current in the transformer is unable to generate any voltage at the conduction and component impedances that leads to switching of the semiconductor switch HS. This can be assured in a manner known to one skilled in the art by a suitable selection of the semiconductor switch HS, the transformer T, and the triggering circuit elements.

Among other features, the exemplary embodiment of FIG. 2 differs from that of FIG. 1 in that the output of the monostable multivibrator MF is additionally provided for triggering a third switch SW3. The switchable path of the switch SW3 is disposed parallel to the recovery diode F1, and the switch SW3 accelerates the demagnetization process. To this end, the output of the monostable multivibrator MF is connected both to one input of the NOR gate NOR and to a control input of the third switch SW3. The controllable path of the third switch SW3 is connected between the terminal Q12 of the primary winding of the transformer T and the second supply potential U3. Any switch with a suitable conducting direction may be used as the third switch SW3. FIG. 2 shows a particular exemplary embodiment of an integratable third switch SW3 in the form of a configuration of two resistors R3 and R4, an n-p-n transistor Q1 acting as an input transistor and a p-n-p transistor Q2 acting as a switching transistor. The base terminal of the transistor Q1 in this case is connected through the resistor R3 which serves to limit the current, to the control input of the switch SW3. The emitter terminal of the transistor Q1 is connected to ground potential, and its collector terminal is connected to the base terminal of the transistor Q2 and through the resistor R4 to the second supply potential U3. The emitter terminal of the transistor Q2 forms one input of the controllable path of the switch SW3 and is connected to the supply potential U3. The collector terminal of the transistor Q2 forms the other input of the controllable path of the switch SW3 and is connected to the terminal Q12 of the transformer T. If the input signal of the monostable multivibrator MF triggered at the trailing edge drops from high to low, then for the duration of the monostable multivibrator time constant, or in other words for longer than it takes for switching on the comparator K and not as long as it takes to switch the comparator K back off again, the terminal Q12 is connected parallel to the free running element F1 through the third switch SW3 to the second supply potential U3, so that the demagnetization of the transformer T proceeds in an accelerated manner. Circuit variants of this kind are particularly recommended in applications having a relatively large capacitive load in the secondary circuit of the transformer as is the case, for instance, with semiconductor switches having a large input capacitor.

The circuit configuration of FIG. 2 also differs from FIG. 1 in that in a circuit configuration according to FIG. 2, a further on-state pulse from the control input S12 to the first switch SW1 cannot be passed on until the demagnetization of the transformer T has been concluded. To this end, a circuit node which is connected to the control input S12 in FIG. 1, is interconnected with the output of an AND gate AND. One input of the AND gate AND forms the control input S12, while the other input of the AND gate AND is acted upon by the inverted output signal of the comparator K. The AND gate AND in FIG. 2 is therefore shown with an inverting input, which is interconnected to the output of the comparator K. The magnetic saturation of the transformer caused by on-state pulses of excessively high repetition rate can be prevented with this variant circuit.

FIG. 2 shows an exemplary embodiment of the second switch SW2 in the form of a bidirectionally conductive semiconductor switch, including two field effect transistors Q3 and Q4. In this case the control input of the switch SW2 is interconnected with the gate terminals of both transistors Q3 and Q4. The source terminals of the two transistors Q3 and Q4 are connected to one another, and the drain terminals of the two transistors Q3 and Q4 each form one input of the controllable path of the switch SW2. In order to provide reliable switching on and off of the switch SW2, the output of the NOR gate NOR should be capable of a sufficiently large voltage jump, for instance between the potentials U1 (closed) and U3 (conducting). Optionally, a suitable driver circuit can be disposed between the output of the NOR gate NOR and the control input of the second switch SW2.

The exemplary embodiment of the first switch SW1 in FIG. 2 includes a circuit like the circuit which forms the third switch SW3, in which the components R3, R4, Q1 and Q2 of the switch SW3 are equivalent to the components R5, R6, Q5 and Q6 in the first switch SW1, but the collector terminal of the p-n-p transistor Q6 is connected to the base terminal of a further n-p-n transistor Q7 and is connected through a further resistor R7 to the emitter terminal of the transistor Q7 and to the first supply potential U1, while the collector terminal of the transistor Q7 is connected to the terminal Q12 of the transformer T. This assures that the first and third switches SW1 and SW3 are switchable by the same trigger potential, even though they switch the terminal Q12 to supply potentials of different polarity.

FIG. 3 shows an exemplary embodiment of a circuit configuration for performing methods according to the invention having a control input S12, which is connected to one input of an AND gate AND. The other input of the AND gate AND is made inverting and is connected to the output of a comparator K and to one input of a NOR gate NOR. The output of the AND gate AND is connected to the input of a monostable multivibrator MF triggered at the trailing edge, to the input of an inverter INV, and to the control input of a first switch SW1. The output of the monostable multivibrator MF is connected to the control input of a third switch SW3 and to a further input of the aforementioned NOR gate NOR. The output of the NOR gate NOR, which is equipped with two inputs, is connected to the control input of a second switch SW2, and the output of the inverter INV is interconnected to the control input of a fourth switch SW4.

A connection terminal Q11 of the primary winding of a transformer T is switchable through the controllable path of the first switch SW1 to the supply potential Udd, and through the controllable path of the fourth switch SW4 to a ground potential Uss. The inverter INV assures that one of these two switches is always open and one of them is always closed. The other connection terminal Q12 of the primary winding of the transformer T is connected to the non-inverting input of the comparator K, is connected through a recovery diode F1 to the supply potential Udd, is switchable through the controllable path of the second switch SW2 to the ground potential Uss, and is switchable through the controllable path of the third switch SW3 to the supply potential Udd. The NOR gate NOR in this case assures that only the switch SW2 or only the switch SW3 can be closed.

The inverting input of the comparator K is acted upon by a reference potential Uref, which is set in the exemplary embodiment in such a way that the inverting input of the comparator K is connected through a first resistor R1 to the supply potential Udd and through a second resistor R2 to the ground potential Uss. The secondary side of the transformer T serves in a known manner for triggering a semiconductor switch HS, which can switch a path between connection terminals A11 and A12.

Once the output of the comparator K is at the low level, and no on-state signal is applied to the control input S12, the first switch SW1 is opened through the AND gate AND, and the fourth switch SW4 is closed through the inverter INV. Furthermore, the third switch SW3 is opened through the monostable multivibrator MF, and the second switch SW2 is closed through the NOR gate NOR. The AND gate AND is enabled at its inverting input through the output of the comparator K.

If an on-state signal is applied to the control input S12, then the first switch SW1 is closed through the AND gate AND, and the fourth switch SW4 is simultaneously opened through the inverter circuit INV. This switching state is shown in FIG. 3. The terminal Q11 of the primary winding of the transformer T is then connected through the switch SW1 to the supply potential Udd, and the terminal Q12 of the primary winding of the transformer T is connected through the switch SW2 to the ground potential Uss. The transformer T absorbs magnetic energy, the semiconductor switch is switched on at the secondary side of the transformer T, and it remains in this state as long as an on-state signal is present at the control input S12.

If the trigger signal at the control input S12 changes from the high to the low level, then the first switch SW1 is opened through the AND gate AND, and the fourth switch SW4 is closed through the inverter. At the same time, the monostable multivibrator MF is triggered by the trailing edge of the output of the AND gate AND, and its output signal assures that the third switch SW3 is closed for the duration of the monostable multivibrator time constant. One input of the NOR gate NOR is also blocked, so that the switch SW2 is opened. The polarity of the voltage applied to the terminals Q11 and Q1 of the primary winding of the transformer T is changed as a result, the semiconductor switch HS is switched off, and the demagnetization process of the transformer T is initiated. The time constant of the monostable multivibrator MF and the switch threshold and therefore the switching times of the comparator K, should be adapted to one another as described for the circuits shown in FIGS. 1 and 2, so that as a consequence of the demagnetization process, the potential at the terminal Q12 will rise through the reference potential Uref, and thus the comparator K will block as a result of a high signal at one input of the NOR gate NOR (and at one input of the AND gate AND) before the output signal of the monostable multivibrator MF changes and opens the third switch SW3 and also no longer blocks the NOR gate at the other input. Once the third switch is opened, the demagnetization continues through the recovery diode F1, and the demagnetizing current decreases linearly, becomes zero, and then changes its algebraic sign as described above. At that instant, the transformer T is demagnetized. The potential at the terminal Q12 of the transformer is virtually equal to the supply potential Udd and then drops. Once the potential at the terminal Q12 attains the reference potential Uref, the comparator K switches a low signal to the NOR gate NOR and to the AND gate AND. The output signal of the NOR gate closes the second switch SW2, thus short-circuiting the primary winding of the transformer T. The AND gate AND is enabled as well.

As was already described for the circuits of FIGS. 1 and 2, the short-circuited primary winding of the transformer T reliably prevents the semiconductor switch HS from being capable of switching. Further switching of the semiconductor switch HS is thus prevented until a new on-state signal is applied to the control input S12.

A method according to the invention can naturally be attained with other logic circuits besides those used in the exemplary embodiments shown in FIGS. 1, 2 and 3. The choice of logical links depends on the selection of the various switches, on the winding direction of the transformer T, and on the type of transformer, among other factors. These relationships are well known to one skilled in the art. If a current measuring winding or some other device for detecting the current of the transformer is provided, then the comparator can also be constructed as a zero-crossover-current detector.

I claim:

1. Circuit configuration for triggering a semiconductor switch, comprising an inductive transformer having a primary winding and having a secondary winding connected to the semiconductor switch to be triggered, a control input, and control means connected between said control input and the primary winding, said control means including a logic circuit connected to said control input, at least one controllable switch controllable by said control input and connected to the primary winding for switching a voltage with a given polarity to the primary winding, means for demagnetizing said transformer including at least one free-running element connected to the primary winding for switching a voltage with a polarity opposite said given polarity to the primary winding, switch means controllable by said logic circuit and being connected to the primary winding for short-circuiting the primary winding, and detector means having input and output connections, said input connection being connected to the primary winding for detecting when the transformer is demagnetized and said output connection being connected to the logic circuit for controlling said switch means.

2. Circuit configuration according to claim 1, including a switch connected parallel to said free-running element for assisting the demagnetization of said transformer.

3. Circuit configuration according to claim 1, wherein said switch means is bidirectionally conducting.

4. Circuit configuration according to claim 2, wherein said switch means is bidirectionally conducting.

* * * * *